(12) United States Patent
Lin et al.

(10) Patent No.: US 10,129,991 B2
(45) Date of Patent: Nov. 13, 2018

(54) FOLDABLE ELECTRONIC DEVICE AND LINKING ASSEMBLY

(71) Applicants: Chia-Chi Lin, Taipei (TW); Jui-Min Huang, Taipei (TW); Chun-Chieh Chen, Taipei (TW); Ching-Tai Chang, Taipei (TW); Cheng-Ya Chi, Taipei (TW)

(72) Inventors: Chia-Chi Lin, Taipei (TW); Jui-Min Huang, Taipei (TW); Chun-Chieh Chen, Taipei (TW); Ching-Tai Chang, Taipei (TW); Cheng-Ya Chi, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 0 days.

(21) Appl. No.: 15/820,441

(22) Filed: Nov. 22, 2017

(65) Prior Publication Data

US 2018/0192528 A1    Jul. 5, 2018

Related U.S. Application Data

(60) Provisional application No. 62/425,597, filed on Nov. 22, 2016.

(51) Int. Cl.
*G06F 1/16* (2006.01)
*H05K 5/02* (2006.01)
(Continued)

(52) U.S. Cl.
CPC ............. *H05K 5/0217* (2013.01); *E05D 3/18* (2013.01); *H05K 5/0017* (2013.01);
(Continued)

(58) Field of Classification Search
CPC .... G06F 1/1652; G06F 1/1616; G06F 1/1641; G06F 1/1681; G06F 1/163; G06F 1/1679;
(Continued)

(56) References Cited

U.S. PATENT DOCUMENTS 9,173,287 B1 * 10/2015 Kim .................... H05K 1/028
9,625,947 B2 *  4/2017 Lee .................... G06F 1/1616
(Continued)

FOREIGN PATENT DOCUMENTS

CN          205750634          11/2016

*Primary Examiner* — James Wu
(74) *Attorney, Agent, or Firm* — JCIPRNET

(57) ABSTRACT

A foldable electronic device and a linking assembly are provided. The foldable electronic device includes a host and a foldable display attached to the host. The host has a first portion, a second portion and a linking assembly connected therebetween. The linking assembly includes N+1 blocks (wherein N is an integer greater than or equal to 2) and a plurality of linking sets. Each block has a body and a pair of fitting portions disposed at two opposite sides of the body in a sliding mirror symmetry manner along a first direction, and the fitting portion of the Nth block is fitted with the fitting portion of the N+1 block. Each linking set has two links, and two ends of the two links overlapping each other lean against the Nth block and can move relative to the Nth block. Other two ends of the two links without overlapping each other are respectively fixed to the N−1th and N+1th blocks. When the link assembly is bent, a virtual center of any two adjacent blocks locates within a scope of the foldable display.

18 Claims, 7 Drawing Sheets

(51) Int. Cl.
*H05K 5/00* (2006.01)
*E05D 3/18* (2006.01)

(52) U.S. Cl.
CPC .......... *G06F 1/1616* (2013.01); *G06F 1/1641* (2013.01); *G06F 1/1652* (2013.01); *G06F 1/1681* (2013.01)

(58) Field of Classification Search
CPC .. H05K 5/0017; H05K 5/0226; H05K 5/0217; E05Y 2900/606; E05D 3/18
See application file for complete search history.

(56) References Cited

U.S. PATENT DOCUMENTS

| | | | |
|---|---|---|---|
| 9,801,290 B2* | 10/2017 | Ahn | H05K 5/0017 |
| 9,891,725 B2* | 2/2018 | Lindblad | G06F 3/0362 |
| 9,915,981 B2* | 3/2018 | Hsu | G06F 1/1681 |
| 2011/0043976 A1* | 2/2011 | Visser | G09F 9/00 361/679.01 |
| 2014/0337621 A1* | 11/2014 | Nakhimov | G06F 1/163 713/168 |
| 2016/0014919 A1 | 1/2016 | Huitema et al. | |
| 2016/0116944 A1* | 4/2016 | Lee | H04M 1/022 361/679.26 |

\* cited by examiner

FOLDABLE ELECTRONIC DEVICE AND LINKING ASSEMBLY

CROSS-REFERENCE TO RELATED APPLICATION

This application claims the priority benefit of U.S. provisional application Ser. No. 62/425,597, filed on Nov. 22, 2016. The entirety of the above-mentioned patent application is hereby incorporated by reference herein and made a part of this specification.

BACKGROUND

Field of the Invention

The disclosure relates to a foldable electronic device and a linking assembly, and more specifically relates to a foldable electronic device having smooth surface when being bent and a linking assembly thereof.

Description of Related Art

Foldable electronic elements, such as flexible electronic circuit, sensor label, flexible organic light-emitting diode (OLED) light source or display, may have internal strain existing in one or many layers. The foldable electronic element is usually produced on flat surface, so bending the foldable electronic element causes strain which is distributed. Because of the strain distribution generated by bending curvature of the element and the internal strain existing in the element can cause a problem that one or many layers of the foldable electronic element is bent, and the excessive strain causes buckling and rupture.

When the foldable electronic element is bent, the surface of the element corresponding to the outer diameter is stretched, and the surface of the element corresponding to the inner diameter is compressed. However, the mechanism coupled with the foldable electronic element hardly prevents the problems that the inner bending surface has wrinkles/folds or is excessively stretched when the foldable electronic element is bent.

SUMMARY

The disclosure provides a foldable electronic device having smoothly bent surface.

The disclosure provides a linking assembly able to prevent wrinkles/folds or stretch.

A foldable electronic device of the disclosure includes a foldable display and a host, and the foldable display is attached to the host, the host has a first portion, a second portion and a linking assembly connected between the first portion and the second portion. The linking assembly includes N+1 blocks (wherein N is an integer greater than or equal to 2) and a plurality of linking sets, each block has a body and a pair of fitting portions disposed at two opposite side surfaces of the body in a sliding mirror symmetry manner along a first direction, and the fitting portion of the Nth block fits with the fitting portion of the N+1 block. Each linking set has two links, and two ends of the two links overlapping with each other lean against the Nth block and capable of moving relative to the Nth block. Two other ends of the two links without overlapping each other are respectively fixed to the N−1th and N+1 blocks. When the link assembly is bent, a virtual center of any two adjacent blocks locates within a scope of the foldable display.

The linking assembly of the disclosure includes N+1 blocks (wherein N is an integer greater than or equal to 2) and a plurality of linking sets, each block has a body and a pair of fitting portions disposed at two opposite side surfaces of the body in a sliding mirror symmetry manner along a first direction, and the fitting portion of the Nth block fits with the fitting portion of the N+1 block. Each linking set has two links, and two ends of the two links overlapping with each other lean against the Nth block and capable of moving relative to the Nth block. Two other ends of the two links without overlapping with each other are respectively fixed to the N−1 th and N+1 th blocks. When the link assembly is bent, a virtual center of any two adjacent blocks locates within a scope of the foldable display.

In one embodiment of the disclosure, the virtual center locates at a surface of the foldable display or at a middle of the thickness of the foldable display.

In one embodiment of the disclosure, a first surface of each of the fitting portions has a protrusion, a second surface of each of the fitting portions has a recess, and the protrusion of the fitting portion of the N−1 th block fits with the recess of the fitting portion of the Nth block.

In one embodiment of the disclosure, at least a side surface different from the side surfaces having the pair of fitting portions of the body has a guiding slot extending along a second direction and a pair of axle holes located on two sides of the guiding slot. In one embodiment of the disclosure, the linking set further includes a sliding bolt and a pair of fasteners, the sliding bolt passes through the two overlapped ends of the two links and leans against the guiding slot of the Nth block, and the fasteners correspondingly pass through the other ends of the two links and are respectively fixed to the axle holes of the bodies of the N−1th and N+1th blocks. A distance between one of the pair of fasteners and the sliding bolt is equal to a distance between another one of the pair of fasteners and the sliding bolt.

In one embodiment of the disclosure, each of the fitting portions has an arc shape, and each of the links has an arc shape or a straight line shape.

Based on the above, when the blocks of the linking assembly in the disclosure rotates, the virtual centers locate at the surface of the foldable electronic device, applying the linking assembly to the foldable electronic device can prevent the situations of having wrinkles/folds and excessive stretching of the foldable display, so as to obtain a smooth curved surface.

In order to make the aforementioned and other features and advantages of the disclosure more comprehensible, embodiments accompanying figures are described in detail belows.

DESCRIPTION OF THE EMBODIMENTS

The First Embodiment

Figure 1:
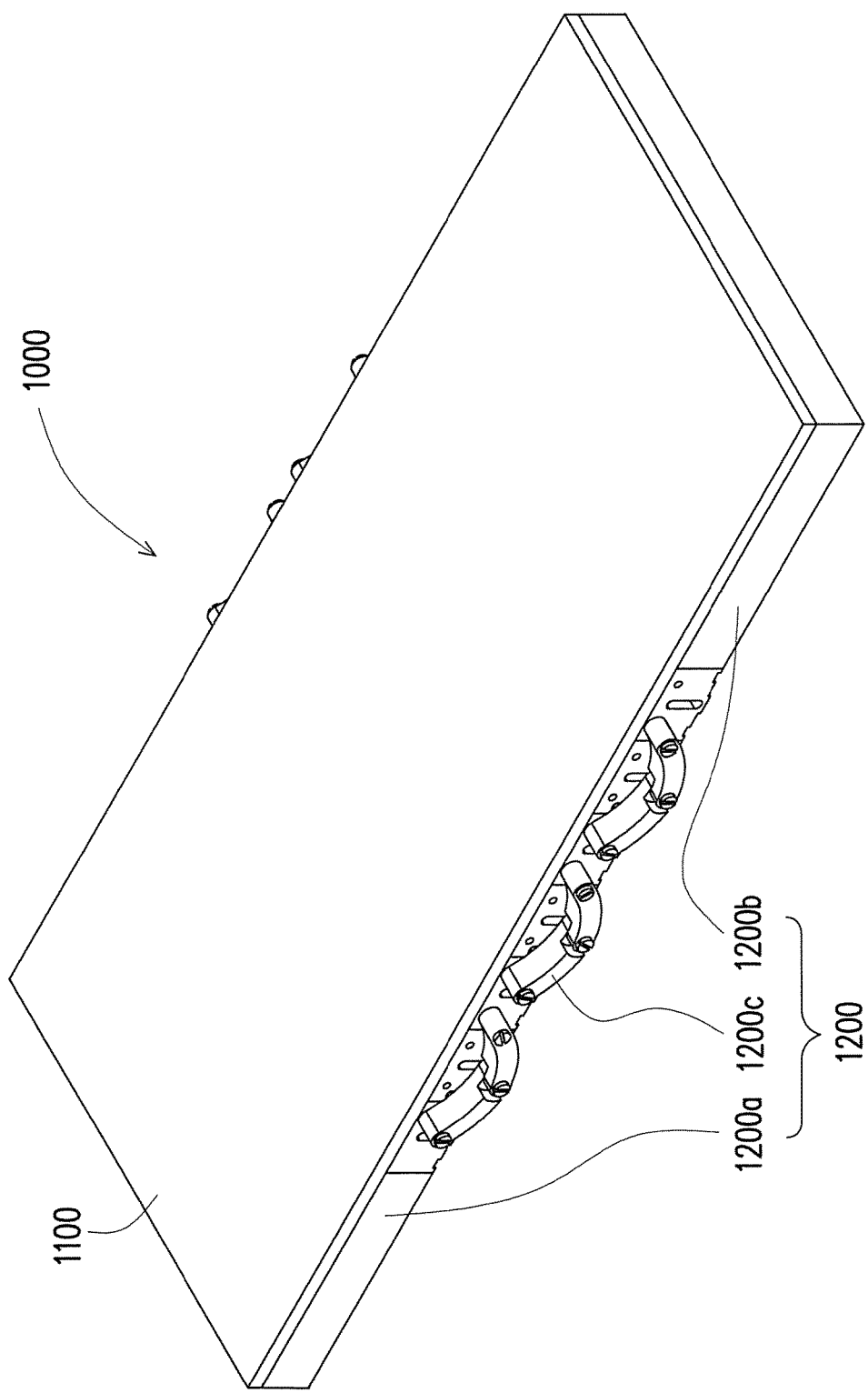
FIG. 1 is a schematic view of a foldable electronic device according to a first embodiment of the disclosure.
Figure 2:
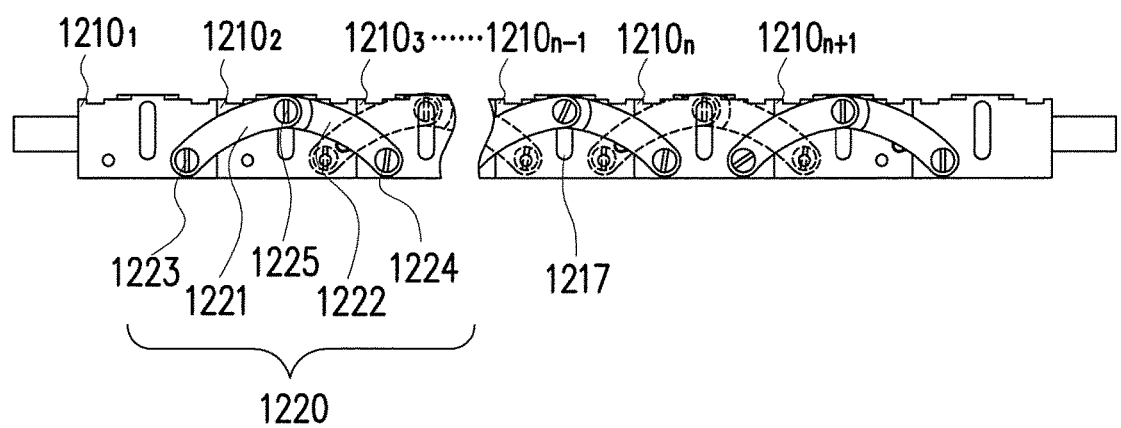
FIG. 2 is a schematic view of a host and a linking assembly of the foldable electronic device in FIG. 1.
Figure 3A:
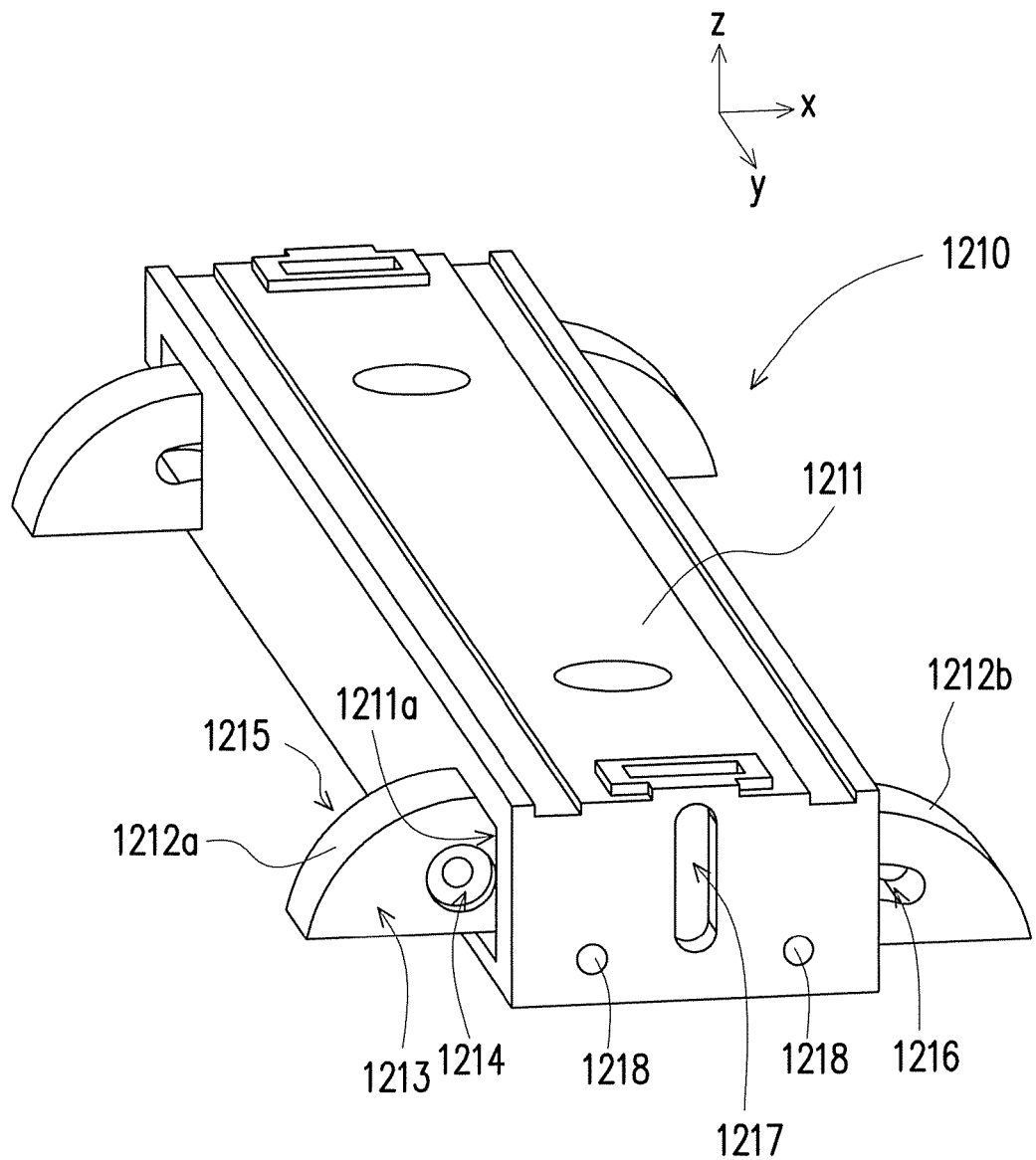
FIG. 3A is a schematic view of a block of the linking assembly.
Figure 4A:
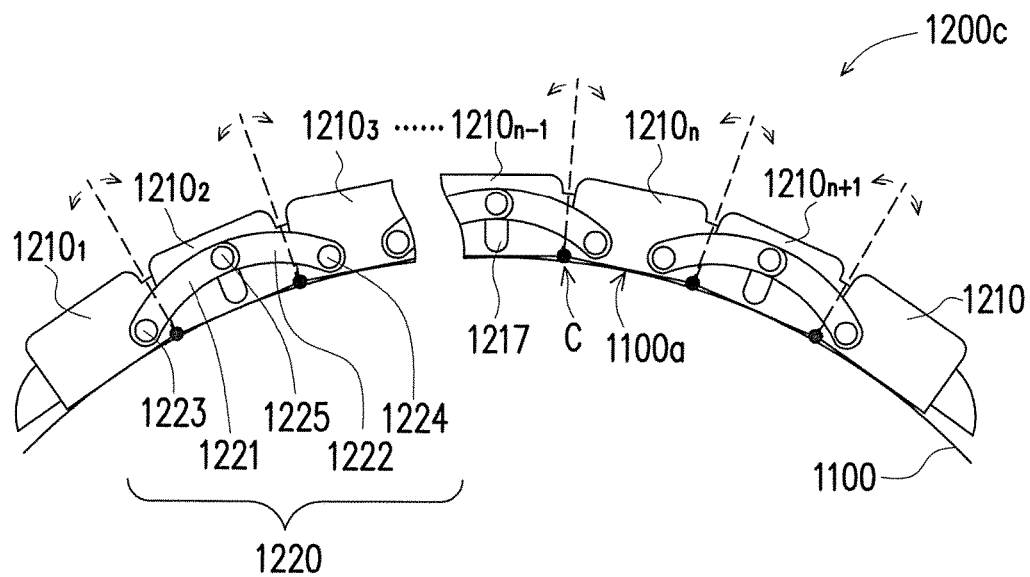
FIG. 4A is a schematic view of the blocks rotating an angle when the linking assembly is bent.

FIG. 1 is a schematic view of a foldable electronic device according to the first embodiment of the disclosure, FIG. 2 is a schematic view of a host and a linking assembly of the foldable electronic device in FIG. 1, and FIG. 3A is a schematic view of a block of the linking assembly. Referring to FIG. 1, FIG. 2, and FIG. 3A at the same time, a foldable electronic device 1000 includes a foldable display 1100 and a host 1200. The foldable display 1100 is attached to the host 1200, and the host 1200 has a first portion 1200a, a second portion 1200b and a linking assembly 1200c connected between the first portion 1200a and the second portion 1200b. The linking assembly 1200c includes N+1 blocks 1210 (wherein N is an integer greater than or equal to 2) and a plurality of linking sets 1220. Each block 1210 has a body 1211 and a pair of fitting portions 1212a and 1212b, and the fitting portions 1212a and 1212b are disposed at two opposite sides of the body 1211 in a sliding mirror symmetry manner along a first direction (X direction). Each of the linking sets 1220 has two links 1221 and 1222, and two ends of the two links 1221 and 1222 overlapping with each other lean against the Nth block 1210n and capable of moving relative to the Nth block 1210n. In addition, other two ends of the two links 1221 and 1222 without overlapping with each other are respectively fixed to the N−1 th block $1210_{n-1}$ and the N+1 block $1210_{n+1}$. When the foldable electronic device 1000 is bent so the first portion 1200a is relatively close to the second portion 1200b, since a virtual center C of any two adjacent blocks 1210 of the linking assembly 1200c locates on a surface 1100a of the foldable display 1100 (as shown in FIG. 4A), the surface 1100a of the foldable display 1100 can be maintained as a smooth surface in order to prevent wrinkles/folds.

The term "sliding mirror symmetry manner", as mentioned above, indicates that the fitting portion 1212a, after mirroring through the first direction (X direction) serving as mirror axis, is translated along the first direction from one side to the other side of the block 1210 to form the fitting portion 1212b which has the same and mirror structure. Because of the mirror relationship, a structure of the fitting portion 1212a that is facing forwards is the structure of the fitting portion 1212b that is facing backwards. Briefly, the structure of the fitting portion 1212a faces backwards is the same as the structure of the fitting portion 1212b face forwards.

Incidentally, it should be understood by a person skilled in the art that all the descriptions of directions such as up, down, left, right, over, under, and on the side of, etc, in this specification are based on certain element or certain position in the drawings as reference point. When the reference point is changed, the description of the orientation of the related components changes as well, the disclosure is not limited thereto.

Figure 3B:
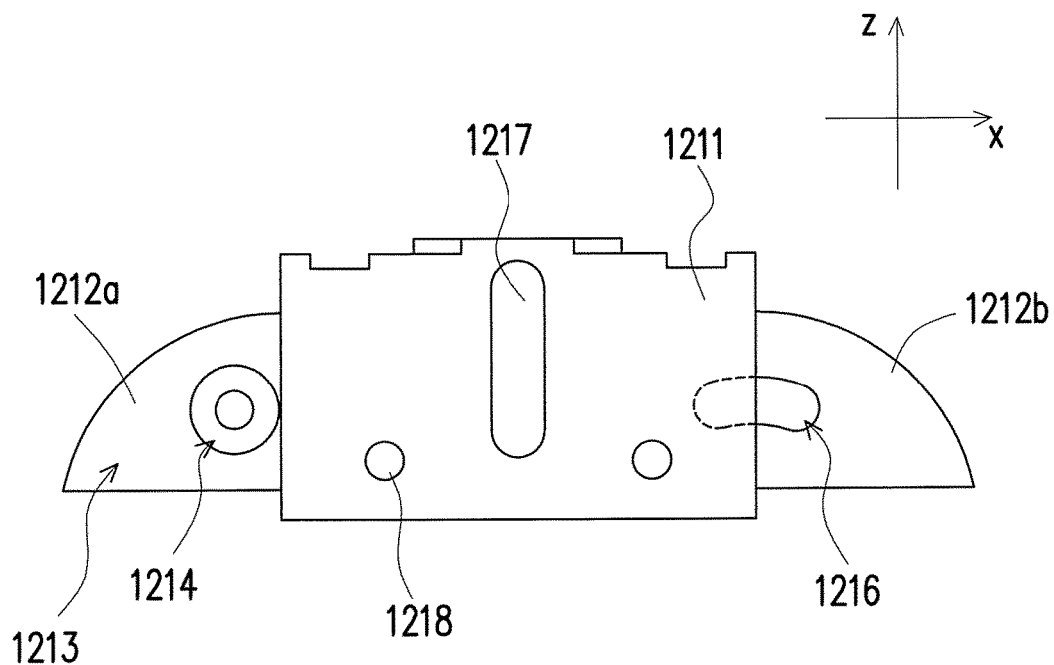
FIG. 3B is a front view of the block in FIG. 3A.
Figure 3C:
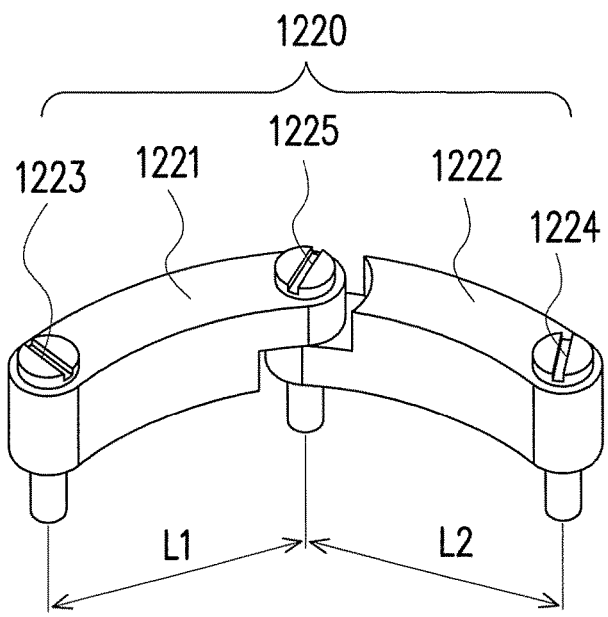
FIG. 3C is a schematic view of one of linking sets in FIG. 2.

FIG. 3B is a front view of the block in FIG. 3A, and FIG. 3C is a schematic view of one of linking sets in FIG. 2. Referring to FIG. 3A, FIG. 3B, and FIG. 3C, the block 1210 has accommodating hollows 1211a on the left and the right sides, the accommodating hollows 1211a is provided with the fitting portion 1212a or 1212b therein, and the fitting portion 1212a or 1212b only occupies a part of the accommodating hollow 1211a instead of occupying the entire accommodating hollow 1211a. The fitting portion 1212a or 1212b of another block 1210 can be inserted into the unoccupied space in the accommodating hollow 1211a, so as to assemble two or more blocks 1210 together. Moreover, the fitting portion 1212a on the left side and the fitting portion 1212b on the right side of one block 1210 are disposed one behind another and stagger with each other, and thus are not disposed on the same plane. Briefly, the fitting portions 1212a and 1212b are disposed in a staggered manner along the Y direction.

Based on above description, take the block 1210 of FIG. 3A as an example, a first surface 1213 of the fitting portion 1212a is a front surface and the protrusion 1214 is disposed on the front surface. A second surface 1215 of the fitting portion 1212a is a back surface and the recess 1216 is disposed on the back surface. On the contrary, the protrusion 1214 is disposed on the back surface of the fitting portion 1212b, and the recess 1216 is disposed on the front surface of the fitting portion 1212b. Briefly, the protrusion 1214 of the fitting portion 1212a located on the left side of the block 1210 is on the font surface while the recess 1216 is on the back surface, and the protrusion 1214 of the fitting portion 1212b located on the right side of the block 1210 is on the back surface while the recess 1216 is on the front surface. Based on the above-mentioned structure of the block 1210, two blocks 1210 can be assembled with each other.

To be more specific, the fitting portion 1212b on the right side of the N−1th block $1210_{n-1}$ can engage with the accommodating hollow 1211a of the left side of the Nth block 1210n, the protrusion 1214 of the fitting portion 1212b on the right side of the N−1th block $1210_{n-1}$ is inserted into the corresponding recess 1216 of the fitting portion 1212a on the left side of the Nth block $1210_n$, and the protrusion 1214 can slide along the path provided by the recess 1216.

A side surface of the body 1211 without the pair of fitting portions 1212a and 1212b disposed thereon has a guiding slot 1217 extending along a second direction (Z direction) and a pair of axle holes 1218 located on two sides of the guiding slot 1217. In order to fix the links 1221 and 1222 to the block 1210, the linking set 1220 further includes a sliding bolt 1225 and a pair of fasteners 1223 and 1224, the sliding bolt 1225 passes through the two overlapped ends of the two links 1221 and 1222 and leans against the guiding slot 1217 of the Nth block $1210_n$, and the fasteners 1223 and 1224 correspondingly pass through the other ends of the two links 1221 and 1222 and are respectively fixed to the axle holes 1218 of the bodies 1211 of the N−1th block $1210_{n-1}$ and the N+1th block $1210_{n+1}$.

In the present embodiment, the shape and the size of each and every of the links 1221 and 1222 are the same, and thus the distances L1 and L2 from the fasteners 1223 and 1224 to the sliding bolt 1225 are equal to each other. Through the configuration of the block 1210 and the linking set 1220 of the linking assembly 1200c as mentioned above, when the linking assembly 1200c is bent, the angles between any two adjacent blocks 1210 in any three adjacent blocks 1210 are equal to each other, and the distance L1 or L2 from the fastener 1223 or 1224 to the sliding bolt 1225 is equal to the distance L2 or L1 from the fastener 1224 or 1223 to the sliding bolt 1225.

Referring to FIG. 3B, more specifically, through the designed shape of the block 1210 with the insertion of the recesses 1216 and the protrusions 1214 of the two fitting portions 1212a and 1212b, when rotating relative to another block 1210, the block 1210 rotates about a virtual center C, which serves as a rotating center, located outside of the block 1210 and located on the surface 1100a of the foldable display 1100.

The linking assembly 1200c and the foldable electronic device 1000 using the linking assembly 1200c of the present application are further described with drawings hereinafter.

Figure 4B:
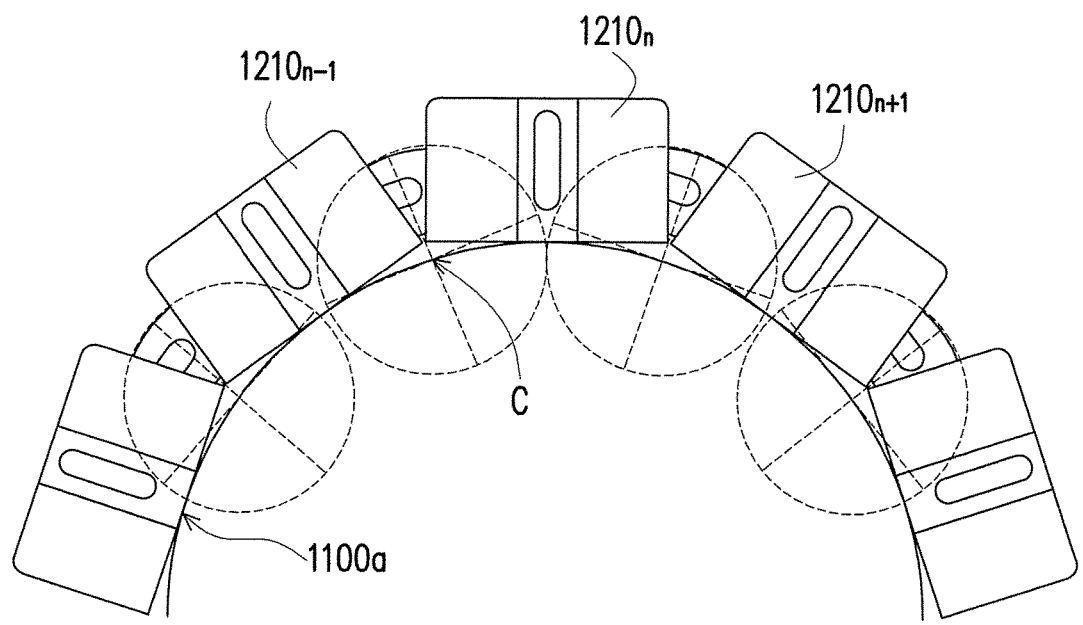
FIG. 4B is a schematic view of an axis of rotation between the blocks in FIG. 4A.
Figure 5:
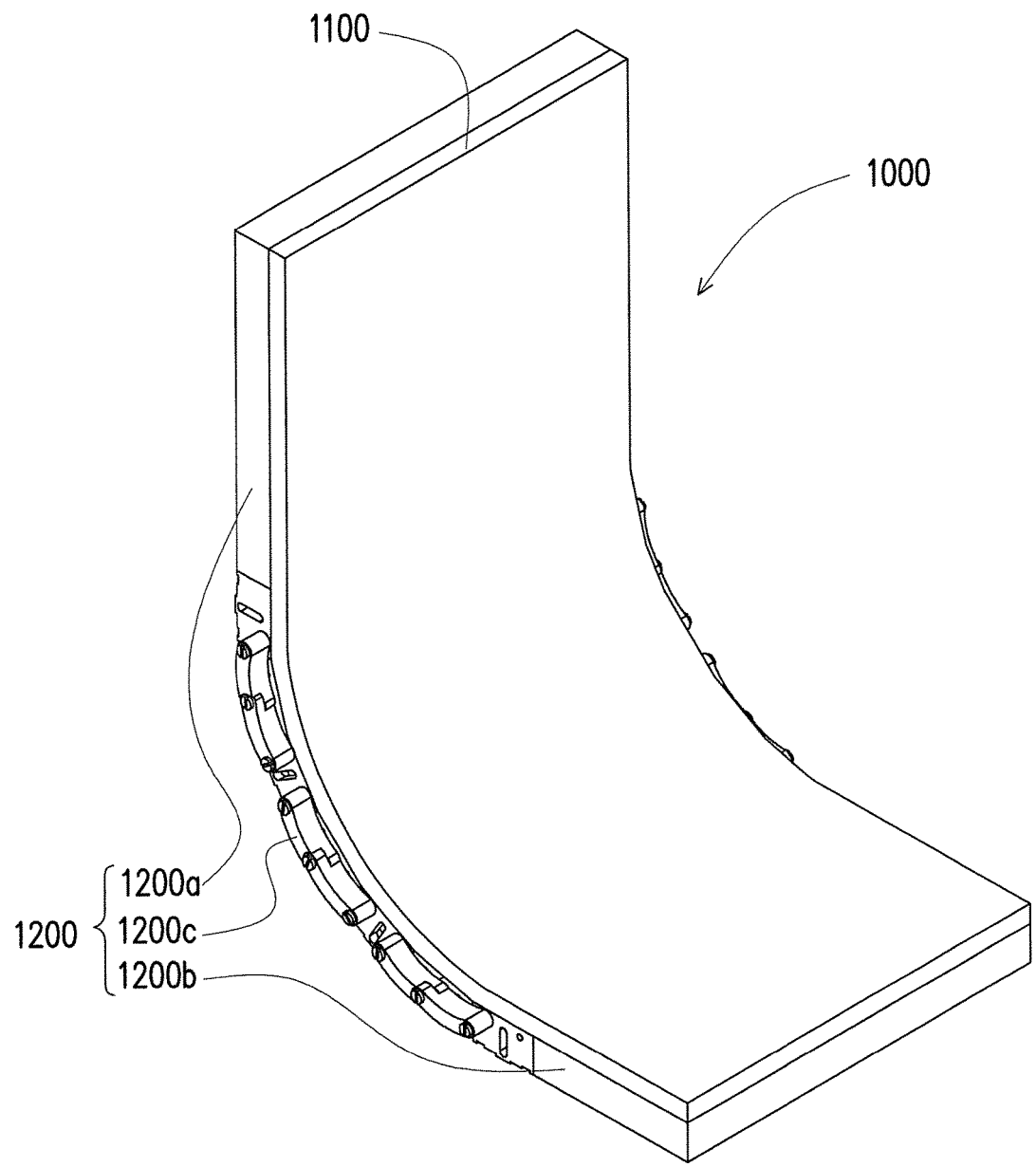
FIG. 5 is a schematic view of the foldable electronic device in FIG. 1 being bent.

FIG. 4A is a schematic view of the blocks rotating when the linking assembly is bent, and FIG. 4B is a schematic view showing a position of an axis of rotation between the blocks in FIG. 4A. FIG. 5 is a schematic view of the foldable electronic device 1000 in FIG. 1 being bent. Referring to FIG. 4A, FIG. 4B, and FIG. 5 at the same time, when bending the foldable electronic device 1000 (shown in FIG. 1), the user raises the first portion 1200a (shown in FIG. 1) of the host 1200 (shown in FIG. 1) so the first portion 1200a becomes relatively close to the second portion 1200b (shown in FIG. 1). Hence, the first block $1210_1$ connecting to the first portion 1200a drives the link 1221, which connects to the first block $1210_1$, of the first linking assembly $1220_2$ so as to move the second block $1210_2$, and then the second block $1210_2$ is limited by the virtual center C and the limiting structure (due to the shape of the fitting portion 1212b) on the right side of the first block $1210_1$. Therefore, the first block $1210_1$ and the second block $1210_2$ rotates the same angle mirrorly in opposite directions about a virtual axis therebetween, which is formed by the coaxial virtual center C. Simultaneously, along with the movement of the blocks $1210_1$ and $1210_2$, the link 1221 drives the sliding block 1225 in the guiding slot 1217 to slide downwards along the Z direction, the sliding block 1225 drives the other link 1222 to rotate so the third block $1210_3$, which the end of the link 1222 is fixed to, is driven to rotate relative to the second block $1210_2$. Specifically, since the links 1221 and 1222 have the same shape and size, the distance L1 from the fastener 1223 fixed to the N−1 th block $1210_{n-1}$ to the sliding bolt 1225 leaning against the Nth block $1210_n$ is equal to the distance L2 from the fastener 1224 fixed to the N+1th block $1210_{n+1}$ to the sliding bolt 1225 leaning against the Nth block $1210_n$, so the N−1th block $1210_{n-1}$, the Nth block $1210_n$, and the N+1th block $1210_{n+1}$ rotate the same angle. As a result, the foldable display 1100 coupled to the linking assembly 1200c has a smooth arc surface, and wrinkles/folds will not be formed on the arc surface.

Based on above description, the linking sets 1220 disposed on two sides of the foldable electronic device 1000 can be staggered from each other. For example, the first linking set 1220 on the left side of the foldable electronic device 1000 may connect the first, the second, and the third blocks $1210_1$, $1210_2$ and $1210_3$, and the second linking set 1220 on the left side of the foldable electronic device 1000 may connect other three blocks 1210 counting from the third block $1210_3$, and so on. Additionally, the first linking set 1220 on the right side of the foldable electronic device 1000 may connect the second block $1210_2$, the third block $1210_3$, and the fourth blocks (not shown), the second linking set 1220 on the right side of the foldable electronic device 1000 may connect the fourth, the fifth and the sixth blocks 1210, and so on, as shown in FIG. 2.

Based on the above, all of N+1 blocks 1210 are connected with each other through the links 1221 and 1222, and when the first block $1210_1$ is raised, the second block $1210_2$ to the N+1 th block $1210_{n+1}$ also move and rotate about the corresponding virtual center which serves as rotating center. Since the distances L1 and L2 from the fasteners 1223 and 1224 to the sliding bolt 1225 are the same, regardless of the bending degree of the foldable electronic device 1000, the rotating angle of each block 1210 in the bent linking assembly 1200c is the same, so the plurality of blocks 1210 can be bent to form a circle arc perfectly.

Incidentally, in other embodiments, the distances L1 and L2 from the fasteners 1223 and 1224 to the sliding bolt 1225 are unequal, so three adjacent blocks 1210 connected with the linking set 1220 rotate different angles, and the assembled blocks 1210 is bent to form a predetermined arc.

Moreover, under the circumstance that, in each linking set 1220, the height of the sliding bolt 1225 is higher than the height of the fasteners 1223 and 1224 (the sliding bolt 1225 is located above the fasteners 1223 and 1224), the foldable display 1100 of the foldable electronic device 1000 is bent inwardly, in order to prevent the foldable display 1100 from creasing due to bending. On the contrary, when the height of the sliding bolt 1225 is lower than the height of the fasteners 1223 and 1224 (the sliding bolt 1225 is located below the fasteners 1223 and 1224, and not shown), the foldable display 1100 is bent outwardly. Hence, through the linking assembly 1200c of the present embodiment, it is possible to prevent the foldable display 1100 from being stretched to form uneven arc.

The Second Embodiment

Figure 6A:
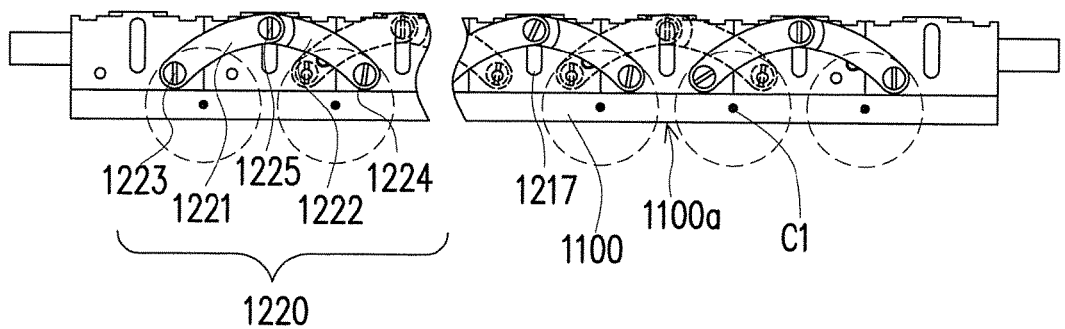
FIG. 6A is a schematic view of a foldable electronic device of a second embodiment illustrating that the virtual center locates at a middle of the thickness of a foldable display.
Figure 6B:
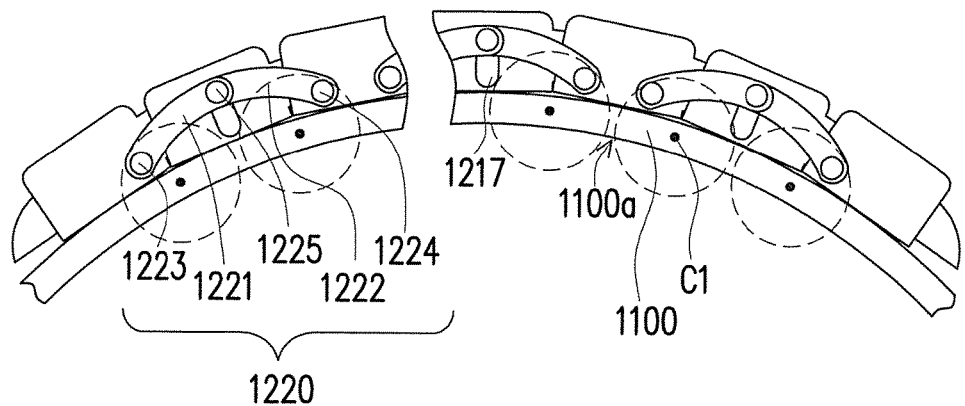
FIG. 6B is a schematic view of the foldable electronic device being bent in the second embodiment illustrating that the virtual center locates at a middle of the thickness of the foldable display.

FIG. 6A is a schematic view of a foldable electronic device of a second embodiment illustrating that the virtual center locates at a middle of the thickness of a foldable display, FIG. 6B is a schematic view of the foldable electronic device being bent in the second embodiment illustrating that the virtual center locates at a middle of the thickness of the foldable display. Referring to FIG. 4A, FIG. 6A, and FIG. 6B simultaneously, the main difference between the first embodiment and the second embodiment is that the virtual center C locates on the surface 1100a of the foldable display 1100 in the first embodiment, and a virtual center C1 locates at the middle of the thickness of the foldable display 1100 in the present embodiment.

The foldable display 1100 may have different thicknesses according to design requirement of the foldable electronic device 1000. In the first embodiment as mentioned above, the virtual center C may be designed to locate on the surface 1100a of the foldable display 1100 or may almost locate on the surface 1100a of the foldable display 1100 since the foldable display 1100 is extremely thin.

However, in the present embodiment, under the circumstance that the foldable display 1100 has a certain thickness, the virtual center C1 can be adjusted to locate in the scope of the foldable display 1100 through adjusting the relative position of the protrusion 1214 (shown in FIG. 3B) on the fitting portion, adjusting the relative position of the recess 1216 (shown in FIG. 3B) on the fitting portion, and adjusting the length of the guiding slot 1217 (shown in FIG. 3B) and the positions of the axle holes 1218.

Specifically, the virtual center C1 locates at the middle of the thickness of the foldable display 1100, so as to prevent the situation that the foldable electronic device 1000 has wrinkles/folds when being bent.

The virtual center C locates on the surface 1100a of the foldable display 1100 in the first embodiment, and the virtual center C1 locates at the middle of the thickness of the foldable display 1100 in the second embodiment. However, a person of ordinary skill in the art will understand that the position of the virtual center within the foldable display can be changed through adjusting the relative positions of the components or structures described above, the purpose of preventing wrinkles/folds is achieved as long as the virtual center is kept within the scope of the foldable display.

To sum up, the foldable electronic device and the linking assembly thereof disclosed in the disclosure have at least the following advantages:

1 Because of the blocks being driven by the links and through the configuration of the fitting portions, the rotating angle of each block is the same when the linking assembly is bent. Therefore, the surface of the foldable display attached to the body presents a smooth arc, and the situations of excessive bending and having wrinkles/folds will not exist.

2. The blocks and the links have fixed shape and structure and cannot be deformed as a spring, so the advantages of stable operation, strong structure and accurate angle can be achieved.

3. The linking set is twisted because of the friction between the link and the block, so the bending degree of the foldable electronic device can be adjusted and fixed.

4. The linking assembly is modularly designed, so the linking assembly can be scaled up or down with the same ratio according to requirements in order to be applied to any devices requiring foldable display, such as smartwatch, smartphone, laptop, all in one (AIO) devices or television, etc.

5. When the foldable electronic device is bent, the virtual center locates within the scope of the foldable display through the linking assembly, and the actual position of the virtual center can be adjusted according to actual requirements, so as to effectively prevent the foldable display from being stretched or having wrinkles/folds.

6. The elements of the linking assembly adopt common parts, and few types of parts are used, so the advantages of easy preparation and low cost can be achieved.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A foldable electronic device, comprising:
   a foldable display;
   a host, the foldable display being attached to the host, wherein the host has a first portion, a second portion and a linking assembly connected between the first portion and the second portion, and the linking assembly comprises:
   N+1 blocks, wherein N is an integer greater than or equal to 2, each block has a body and a pair of fitting portions disposed at two opposite side surfaces of the body in a sliding mirror symmetry manner along a first direction, and the fitting portion of the Nth block is fitted with the fitting portion of the N+1 block; and
   a plurality of linking sets, wherein each of the linking sets has two links, two ends of the two links overlapping with each other lean against the Nth block and capable of moving relative to the Nth block, two other ends of the two links without overlapping with each other are respectively fixed to the N−1th and N+1 blocks, and
   wherein, when the link assembly is bent, a virtual center of rotation of any two adjacent blocks locates within a scope of the foldable display.

2. The foldable electronic device as recited in claim 1, wherein the virtual center locates at a surface of the foldable display.

3. The foldable electronic device as recited in claim 1, wherein the virtual center locates at a middle of the thickness of the foldable display.

4. The foldable electronic device as recited in claim 1, wherein a first surface of each of the fitting portions has a protrusion, a second surface of each of the fitting portions has a recess, and the protrusion of the fitting portion of the N−1 th block fits with the recess of the fitting portion of the Nth block.

5. The foldable electronic device as recited in claim 1, wherein each of the fitting portions has an arc shape.

6. The foldable electronic device as recited in claim 1, wherein at least a side surface different from the side surfaces having the pair of fitting portions of the body has a guiding slot extending along a second direction and a pair of axle holes located on two sides of the guiding slot.

7. The foldable electronic device as recited in claim 6, wherein the linking set further comprises a sliding bolt and a pair of fasteners, the sliding bolt passes through the two overlapped ends of the two links and leans against the guiding slot of the Nth block, and the fasteners correspondingly pass through the other ends of the two links and are respectively fixed to the axle holes of the bodies of the N−1th and N+1 th blocks.

8. The foldable electronic device as recited in claim 7, wherein a distance between one of the pair of fasteners and the sliding bolt is equal to a distance between another one of the pair of fasteners and the sliding bolt.

9. The foldable electronic device as recited in claim 7, wherein each of the links has an arc shape or a straight line shape.

10. A linking assembly, comprising:
    N+1 blocks, wherein N is an integer greater than or equal to 2, each block has a body and a pair of fitting portions disposed at two opposite side surfaces of the body in a sliding mirror symmetry manner along a first direction, and the fitting portion of the Nth block is fitted with the fitting portion of the N+1 block; and
    a plurality of linking sets, wherein each of the linking sets has two links, two ends of the two links overlapping with each other lean against the Nth block and capable of moving relative to the Nth block, two other ends of the two links without overlapping with each other are respectively fixed to the N−1th and N+1th blocks, and
    wherein, when the link assembly is bent, a virtual center of rotation of any two adjacent blocks locates within a scope of the foldable display.

11. The linking assembly as recited in claim 10, wherein the virtual center locates on a surface of the foldable display.

12. The linking assembly as recited in claim 10, wherein the virtual center locates at a middle of the thickness of the foldable display.

13. The linking assembly as recited in claim 10, wherein each of the fitting portions has an arc shape.

14. The linking assembly as recited in claim 10, wherein a first surface of each of the fitting portions has a protrusion, a second surface of each of the fitting portions has a recess, and the protrusion of the fitting portion of the N−1th block fits with the recess of the fitting portion of the Nth block.

15. The linking assembly as recited in claim 10, wherein at least a side surface different from the side surfaces having the pair of fitting portions of the body has a guiding slot extending along a second direction and a pair of axle holes located on two sides of the guiding slot.

16. The linking assembly as recited in claim 15, further comprising a sliding bolt and a pair of fasteners, the sliding bolt passes through the two overlapped ends of the two links and leans against the guiding slot of the Nth block, and the fasteners correspondingly passing through the other ends of the two links are respectively fixed to the axle holes of the bodies of the N−1th and N+1th blocks.

17. The linking assembly as recited in claim 16, wherein a distance between one of the pair of fasteners and the sliding bolt is equal to a distance between another one of the pair of fasteners and the sliding bolt.

18. The linking assembly as recited in claim 16, wherein each of the links has an arc shape or a straight line shape.

* * * * *